(12) United States Patent
Prüssmeier

(10) Patent No.: US 9,184,740 B2
(45) Date of Patent: Nov. 10, 2015

(54) POWER CIRCUIT WITH SHORT-CIRCUIT PROTECTION CIRCUIT

(75) Inventor: Uwe Prüssmeier, Lemgo (DE)

(73) Assignee: BECKHOFF AUTOMATION GMBH, Verl (DE)

( * ) Notice: Subject to any disclaimer, the term of this patent is extended or adjusted under 35 U.S.C. 154(b) by 349 days.

(21) Appl. No.: 12/268,142

(22) Filed: Nov. 10, 2008

(65) Prior Publication Data

US 2009/0103223 A1    Apr. 23, 2009

Related U.S. Application Data

(63) Continuation of application No. PCT/EP2007/004280, filed on May 14, 2007.

(30) Foreign Application Priority Data

May 12, 2006 (DE) .......................... 10 2006 022 158

(51) Int. Cl.
| | | |
|---|---|---|
| H02H 9/04 | (2006.01) | |
| H03K 17/082 | (2006.01) | |
| H03K 17/687 | (2006.01) | |

(52) U.S. Cl.
CPC ........ *H03K 17/0822* (2013.01); *H03K 17/6874* (2013.01)

(58) Field of Classification Search
CPC ..................... H03K 17/6874; H03K 17/0822
USPC ......................................................... 361/93.9
See application file for complete search history.

(56) References Cited

U.S. PATENT DOCUMENTS

| | | | | |
|---|---|---|---|---|
| 4,429,339 | A * | 1/1984 | Jaeschke et al. ............. | 361/93.7 |
| 4,620,258 | A | 10/1986 | Bloomer | |
| 4,849,850 | A * | 7/1989 | Brahms ......................... | 361/101 |
| 4,893,211 | A * | 1/1990 | Bynum et al. .................. | 361/18 |
| 4,937,697 | A | 6/1990 | Edwards et al. | |
| 5,621,277 | A * | 4/1997 | Ricca ............................. | 315/86 |
| 5,801,514 | A * | 9/1998 | Saeki et al. ................... | 320/136 |
| 5,914,545 | A * | 6/1999 | Pollersbeck .................. | 307/131 |
| 6,018,202 | A * | 1/2000 | Meinders et al. ............. | 307/10.6 |
| 6,269,011 | B1 * | 7/2001 | Ohshima ........................ | 363/50 |

(Continued)

FOREIGN PATENT DOCUMENTS

| | | |
|---|---|---|
| DE | 19842045 | 3/2000 |
| DE | 19854914 | 6/2000 |

(Continued)

OTHER PUBLICATIONS

German office action for corresponding application No. DE 10 2006 022 158.3.
International Search Report for corresponding application No. PCT/EP2007/004280.

(Continued)

*Primary Examiner* — Stephen W Jackson
*Assistant Examiner* — Nicholas Ieva
(74) *Attorney, Agent, or Firm* — Dorsey & Whitney LLP; Nathaniel P. Longley

(57) ABSTRACT

A power circuit including a current-limiting semi-conductor switch and a control system connected to the current-limiting semi-conductor switch and configured to bias the semi-conductor switch into conduction and into cut-off. The control system further comprises a short-circuit protection circuit configured to detect and evaluate the voltage drop via the current-limiting semi-conductor switch.

8 Claims, 1 Drawing Sheet

(56) References Cited

U.S. PATENT DOCUMENTS

| | | | |
|---|---|---|---|
| 2002/0126031 A1* | 9/2002 | Hoenlein et al. | 341/154 |
| 2004/0027759 A1* | 2/2004 | Katoh | 361/93.7 |
| 2006/0132997 A1* | 6/2006 | Chu et al. | 361/79 |

FOREIGN PATENT DOCUMENTS

| | | |
|---|---|---|
| DE | 19936857 | 2/2001 |
| DE | 69808044 | 2/2003 |
| GB | 2158314 | 11/1985 |
| GB | 2278025 | 11/1994 |
| WO | 95/07570 | 3/1995 |

OTHER PUBLICATIONS

Infineon data sheet concerning SPP17N80C3 Cool MOS Power Translator dated Aug. 2, 2005.

NXP Semiconductors data sheet concerning power semiconductor PSMN2RO-30YL, pp. 2 and 3.

* cited by examiner

POWER CIRCUIT WITH SHORT-CIRCUIT PROTECTION CIRCUIT

CROSS-REFERENCE TO RELATED APPLICATION(S)

This application is a continuation of International Patent Application No. PCT/EP2007/004280, filed on May 14, 2007, which claims priority to German Application No. 10 2006 022 158.3, filed on May 12, 2006, the contents of which are hereby incorporated in their entirety by reference herein.

FIELD

The present invention relates to power circuits and, more particularly, a power circuit comprising a current-limiting semi-conductor switch and a control system connected to the current-limiting semi-conductor switch for biasing the semi-conductor switch into conduction and cut-off, the control system comprising a short-circuit protection circuit for the current-limiting semi-conductor switch.

BACKGROUND

Power semi-conductor switches which are able to switch electric currents of more than 1 A are characterized by having a simple control system and a high service life since they do not comprise parts tending toward wearing. Such power semi-conductors are in particular applied for switching supply voltages and as dimmers in order to continuously adjust the power of electric lamps, light fixtures or motors.

Apart from thyristors and bipolar transistors, field-effect transistors, which are characterized by a rapid switching behavior, are increasingly used as power semi-conductors. Furthermore, the positive temperature coefficient is advantageous in field-effect transistors, the positive temperature coefficient allowing for the implementation of a simple parallel circuit. Above all, n-channel field-effect transistors with a drift range in the area of the drain electrode are applied as power field-effect transistors.

Field-effect transistors may be operated as forward phase control dimmers and as well as reverse phase control dimmers for controlling the power emitted from an AC voltage source to a consumer. In forward phase controlling, the power emitted to the consumer by the AC voltage source is reduced by the fact that the beginning of the positive or the negative half-wave, respectively, is cut off according to the power to be controlled. In reverse phase controlling, in contrast, the power is reduced in the consumer in that the AC voltage is, beginning at the voltage pass through zero, switched through to the consumer delayed according to the power to be controlled or interrupted ahead of time, respectively. The reverse phase controlling is of the advantage, compared to the forward phase control, that no steep voltage edges occur when switched on.

Power circuits for switching and dimming AC voltages with field-effect transistors, as semi-conductor switches typically comprise two n-channel field-effect transistors connected in series with a drift range in the area of the drain electrode, the source electrodes of the two field-effected transistors being connected to each other. The drain electrode of the one field-effect transistor is then connected to the AC voltage source, and the drain electrode of the other field-effect transistor is connected to the consumer. The gate electrodes of the two field-effect transistors are connected to a control system controlling the gate voltage in order to bias into conduction and bias into cut-off the field-effect transistors and to thus adjust the power emitted from the AC voltage to the consumer.

In order to render the power circuit with the field-effect transistors arranged in series short-circuit proof, i.e. to prevent, on occurrence of a short-circuit in the consumer, that the power indicated by the AC voltage source damages or destroys the field-effect transistors by overheating, the power circuits normally comprise an additional short-circuit protection circuit.

According to the circuit configuration as commonly used, an additional ohmic resistor is connected in the current path for achieving the short circuit strength between the two source electrodes of the field-effect transistors. The control system connected to the gate electrodes of the field-effect transistors scans the voltage drop via this ohmic resistor. When the voltage drop increases considerably due to a short-circuit in the down-stream consumer, this voltage drop is registered by the control system and thereupon, the two field-effect transistors are switched off. This conventional short-circuit protection circuit leads to an undesired power loss due to the ohmic resistor additionally connected to the current path.

In order to prevent such a power loss, a short-circuit protection circuit for a forward phase control mode of a power circuit with two field-effect transistors being connected in series via the source electrodes is provided. In this short-circuit protection circuit, additional components for measuring the variation of the gate electrode potential in relation to the voltages applied between the source electrodes and the drain electrodes are provided. On the basis of the measuring results, the switching of the field-effect transistors into the conducting state is either allowed or prevented. This known short-circuit protection circuit is, however, complex and only applicable in the context of forward phase controlling.

SUMMARY

The present invention provides a power circuit having a semi-conductor switch which is characterized by a simple and reliable short-circuit protection circuit for the prevention of damage or destruction, respectively, of the semi-conductor switch in the case of short-circuits in the downstream consumer without the short-circuit protection circuit leading to additional power losses.

According to one embodiment of the present invention, a power circuit comprises a current-limiting semi-conductor switch and a control system being connected to the current-limiting semi-conductor switch and being configured to bias into conduction and to bias into cut-off the semi-conductor switch. The control system further comprises a short-circuit protection circuit, the short-circuit protection circuit being configured to detect and evaluate the voltage drop via the current-limiting semi-conductor switch.

By applying, according to the present invention, a current-limiting semi-conductor switch in the power circuit and by detecting and evaluating the voltage drop via this current-limiting semi-conductor switch, it is possible in the case of a short-circuit in the downstream consumer to prevent a damaging or destroying of the current-limiting semiconductor switch in the forward phase control as well as in the reverse phase control by switching-off the current-limiting semi-conductor switch at an increased voltage drop. The current-limiting property of the semi-conductor switch therein provides for the fact that in the case of a short-circuit of the downstream consumer a current-saturation mode occurs in the semi-conductor switch resulting, in turn, in the fact that a leap in the voltage drop occurs via the current-limiting semi-conductor switch. This leap in the voltage drop can be detected and evaluated to then carry out corresponding measures for the protection of the semi-conductor switch.

According to another embodiment of the present invention, the current-limiting semiconductor switch is configured as a field-effect transistor, the control system being connected to the gate electrode of the field-effect transistor for biasing into conduction and biasing into cut-off the field-effect transistor. By applying a field-effect transistor, a rapid switching of the power electronics can be achieved and in particular also the positive temperature coefficient, which provides for a thermal self-protection can be made use of.

According to another embodiment of the present invention, the field-effect transistor is further operated at a maximal gate voltage, which results in a current limitation below the maximally allowed current load of the field-effect transistor. By this configuration of the power circuit it is ensured that the field-effect transistor comprises sufficient reserves with respect to the possible current load on occurrence of a short-circuit. It can then endure this state for a comparably long time, e.g. more than 100 µsec without being damaged. Thus, the control system is given enough time for switching-off the field-effect transistor in due time. Furthermore, an undesired switching-off of the field-effect transistor when switching-on during which a short-time voltage increase occurs can be prevented since a short-circuit evaluation can correspondingly be delayed by the control system without damaging the field-effect transistor. In addition, the short-circuit current in the power line is limited and can be adjusted in certain ranges. This preserves other power line components and also provides for the fact that a fuse connected ahead does not trigger. In some preferred embodiments, the value of the maximally allowable current load therein corresponds at least the threefold of the saturation current of the field-effect transistor.

According to another embodiment of the present invention, the short-circuit protection circuit comprises an ohmic resistor which is connected to the drain electrode of the field-effect transistor. By this, a simple configuration of the short-circuit protection circuit is ensured since via the ohmic resistor, the voltage limit can be defined which is evaluated by the short-circuit protection circuit as the existence of a short-circuit in the consumer.

According to another embodiment of the present invention, the power circuit serves for the operation of a consumer having an AC voltage, the power circuit comprising two field-effect transistors which are arranged in series and which are connected to each other via the source electrodes, the field-effect transistors comprising parallel to the source electrode and the drain electrode of both field-effect transistors a diode which is switched in forward bias. By this configuration, a forward phase control mode as well as a reverse phase control mode with short-circuit protection can be ensured in a simple manner.

BRIEF DESCRIPTION OF THE DRAWINGS

The appended drawings illustrate some embodiments of the present invention and are therefore not to be considered limiting of its scope, for the present invention may admit to other equally effective embodiments.

DETAILED DESCRIPTION

In the following, reference is made to embodiments of the present invention. However, it should be understood that the present invention is not limited to specific described embodiments. Instead, any combination of the following features and elements, whether related to different embodiments or not, is contemplated to implement and practice the present invention. Furthermore, in various embodiments the present invention provides numerous advantages over the prior art. However, although embodiments of the present invention may achieve advantages over other possible solutions and/or over the prior art, whether or not a particular advantage is achieved by a given embodiment is not limiting of the present invention. Thus, the following aspects, features, embodiments and advantages are merely illustrative and are not considered elements or limitations of the appended claims except where explicitly recited in a claim(s). Likewise, reference to "the present invention" shall not be construed as a generalization of any inventive subject matter disclosed herein and shall not be considered to be an element or limitation of the appended claims except where explicitly recited in a claim(s).

Also, signal names used below are exemplary names, indicative of signals used to perform various functions in a given power control system. In some cases, the relative signals may vary from device to device. Furthermore, the circuits and devices described below and depicted in the figures are merely exemplary of embodiments of the present invention. As recognized by those of ordinary skill in the art, embodiments of the present invention may be utilized with any power control system.

With regard to fastening, mounting, attaching or connecting components of the present invention, unless specifically described as otherwise, conventional fasteners and methods may be used including, for example, mechanical fasteners, adhesives, welding and soldering, etc. Suitable electrical components and circuitry, wires, wireless components, chips, boards, microprocessors, inputs, outputs, displays, control components, etc. may be used. Generally, unless otherwise indicated, the materials for making the invention and/or its components may be selected from appropriate materials such as metal, metallic alloys, ceramics, plastics, etc.

Figure 1:
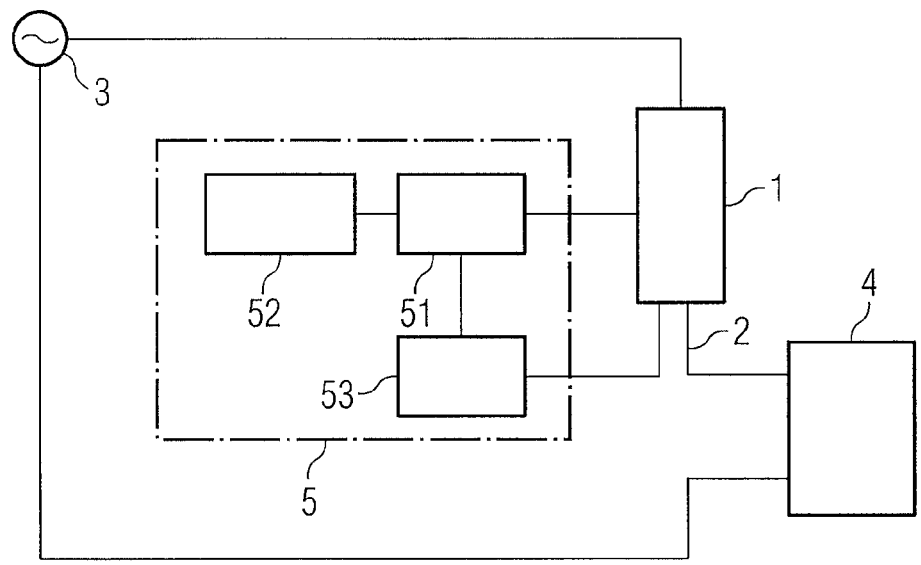
FIG. 1 is a schematic illustration of an embodiment of a power control system according to the present invention in a block diagram.

FIG. 1 shows in a simplified way an embodiment of a power circuit according to the present invention for switching and continuously controlling a power fed to a consumer. The power control system is herein suitable for the terminal voltage setting of a power emitted by an AC voltage source, in particular by a supply voltage source in the area of 0 to 100% of the provided power. The power control system according to the present invention can therein be applied in the forward phase control mode as well as in the reverse phase control mode. The power control system according to the present invention can e.g. be applied as a dimmer for a light fixture.

The power control system according to the present invention comprises a current-limiting semi-conductor switch 1 which is switched into a current path 2 between a voltage source 3 and a consumer 4. The current-limiting semi-conductor switch 1 is operated via a control system 5 for biasing into conduction and biasing into cut-off the current-limiting semi-conductor switch 1. The control system 5 therefore comprises a microcontroller 51, which is connected to a voltage supply 52 in order to emit voltage impulses to the current-limiting semi-conductor switch for biasing into conduction and for biasing into cut-off. The electric current fed to the consumer 4 therein is determined by the operating cycle of the microcontroller 51 which determines the ratio between the time period in which the current-limiting semi-conductor switch 1 is conductive and thus lets current pass and the time period in which the current-limiting semi-conductor switch blocks.

In order to prevent a damaging or destruction of the current-limiting semi-conductor switch 1 by a short-circuit in the consumer 4, the control system comprises a short-circuit protection circuit 53 which is connected to the current-limiting semi-conductor switch 1 and the microcontroller 51 and which detects and evaluates the voltage drop via the current-limiting semi-conductor switch 1. The current-limiting semi-conductor switch 1 is therein dimensioned such that a current limitation is also effected when fully biasing into conduction below the maximally allowed current load so that the current-limiting semi-conductor switch 1 endures the application of the full supply voltage for some ten microseconds, e.g. for at least 100 microseconds.

The current-limiting semi-conductor switch is further configured such that its ohmic resistor is small in regular operation, i.e. when the rated current flows which leads to the fact that then only a small voltage drop occurs. In the case of a short-circuit in the consumer, in a current-limiting semi-conductor switch biased into conduction, the electric current flowing through the semi-conductor switch then rises to the saturation value, i.e. the current-limiting semi-conductor switch turns into a constant current source. At the same time, the voltage drop via the current-limiting semi-conductor switch reaches the value of the supply voltage, e.g. the supply line AC voltage of 360V. This increase of the voltage drop via the current-limiting semi-conductor switch is detected by the short-circuit protection circuit 53 which thereupon switches off the current-limiting semi-conductor switch via the connected microcontroller 51 and thus protects against damaging or destruction.

In some preferred embodiments, the current-limiting semi-conductor switch 1 is configured as a field-effect transistor in which the source electrode and the drain electrode are connected into the current path and in which the field-effect transistor is biased into conduction and biased into cut-off via its gate electrode by the microcontroller 51 of the control system 5. In some preferred embodiments, n-channel field-effect transistors with a drift range in the area of the drain electrode are applied as field-effect transistors.

In some preferred embodiments, the short-circuit protection switch is therein formed by a resistance element, e.g. a high-impedance resistance element, which is connected to the drain electrode of the field-effect transistor. With this configuration, it is then possible that a source-drain-voltage is evaluated via a standard logic input. A voltage level of e.g. more than 2.5V is as a logic "1" recognized as a short-circuit in the consumer by the microcontroller, whereupon the microcontroller 51 blocks the field-effect transistor.

Figure 2:
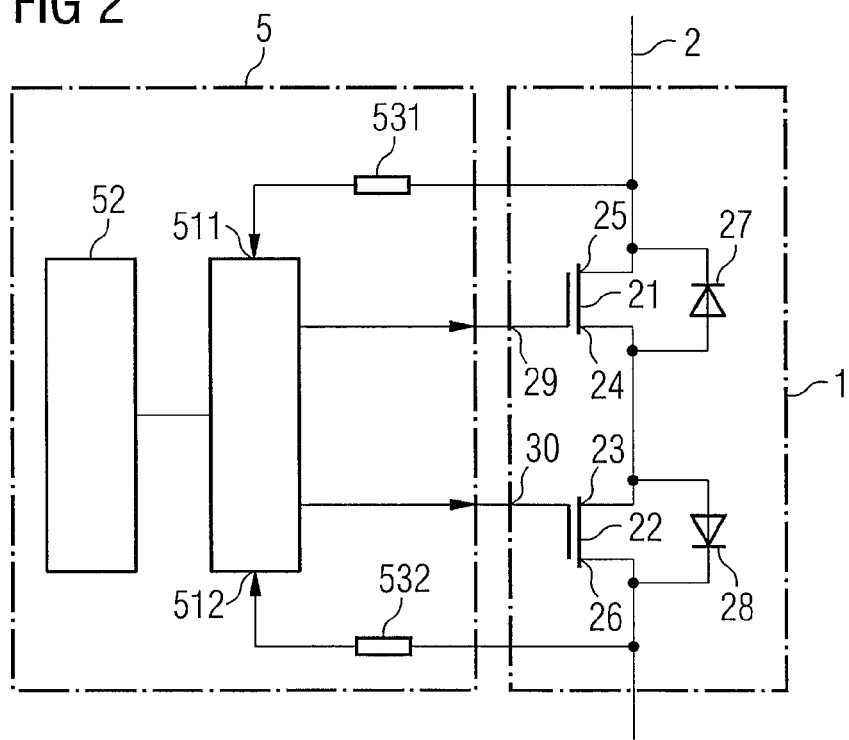
FIG. 2 shows an embodiment of the power control system according to the present invention.

FIG. 2 shows an embodiment of a power circuit according to the present invention, which is suitable for switching and continuous controlling of a supply line AC voltage. The current-limiting semi-conductor switch 1 therein consists of two field-effect transistors 21, 22 arranged in series, which are connected to each other via their source electrodes 23, 24. The drain electrode 25 of the first field-effect transistor 21 is connected to the supply line AC voltage source (not shown). The drain electrode 26 of the second field-effect transistor 22 is connected to the consumer (not shown). Parallel to the source electrode and the drain electrode of each of the two field-effect transistors 21, 22, a diode 27, 28 is connected in forward bias ensuring that the two half-waves of the supply line AC voltage are in an optimal way used for the power supply of the consumer.

The gate electrodes 29, 30 of the two field-effect transistors 21, 22 are connected to the microcontroller 51 of the control system 5 which switches through the gate voltage generated by the downstream voltage supply to the two gate electrodes 29, 30 according to the desired power controlling. The short-circuit protection circuit 53 comprises two high-impedance resistors 531, 532 which each are connected to the interrupt inputs 511, 512 of the microcontroller 51. The two high-impedance resistors 531, 532 are further connected to the drain electrodes 25, 26 of the field-effect transistors 21, 22 and, in some preferred embodiments, are configured such that a voltage drop exceeding the gate voltage between the source electrode and the drain electrode of the associated field-effect transistor is evaluated as a logic "1" state which indicates a short-circuit by the microcontroller 51. The microcontroller 51 thereupon switches off the two field-effect transistors 21, 22, thus protecting them from being damaged or destroyed.

In some preferred embodiments, the field-effect transistors 21, 22 each comprise a small resistor in the switched-through state, e.g. in the area of 100 mΩ. This leads to the fact that a voltage drop of 200 mV occurs for a rated current to be switched in the field of 2 A in the switched-through operation. The field-effect transistors are further dimensioned such that at a gate voltage of 5V a saturation current exists in the field of 10 A, the field-effect transistors enduring current peaks corresponding to at least the three-fold of the saturation current. Hereby, sufficient reserves for the case of a short-circuit in the downstream consumer are provided so that the field-effect transistors endure the full supply line AC voltage of 230V for at least 100 μsec. In this period of time, it is without problems possible for the control system comprising the short-circuit protection circuit according to the present invention to detect the leap in the voltage drop on occurrence of a short-circuit and to switch-off the field-effect transistors.

By applying a current-limiting semi-conductor switch in a power circuit short-circuit protection without power consumption is made possible by detecting an increased voltage drop in the case of a short-circuit via the current-limiting semi-conductor switch.

While the foregoing is directed to embodiments of the present invention, other and further embodiments of this present invention may be devised without departing from the basic scope of the present invention, the scope of the present invention being determined by the claims that follow.

The invention claimed is:

1. A power circuit comprising:
   a current-limiting semi-conductor switch configured as a field-effect transistor; and
   a control system connected to the current-limiting semi-conductor switch and configured to bias the semi-conductor switch into conduction and into cut-off, wherein the control system comprises a microcontroller and a high-impedance resistor, the high-impedance resistor connected to a drain electrode of the field-effect transistor and to an interrupt input of the microcontroller and configured to apply a voltage drop via the field-effect transistor to the interrupt input of the microcontroller, a level of the voltage drop exceeding a predetermined voltage level recognized as a short-circuit by the microcontroller, whereupon the microcontroller biases the semi-conductor switch into cut-off;
   wherein the current-limiting semi-conductor switch is configured such that its ohmic resistor is small when a rated current flows which leads to a small voltage drop; and wherein the current-limiting semi-conductor switch is dimensioned such that a current limitation is effected when fully biasing into conduction below a maximally allowed current load so that the current-limiting semi-conductor switch endures the application of a full supply voltage for at least ten microseconds.

2. The power circuit according to claim 1, wherein the control system is connected to a gate electrode of the field-effect transistor, the control system configured to bias the field-effect transistor into conduction and into cut-off.

3. The power circuit according to claim 2, wherein the field-effect transistor is operated at a maximal gate voltage which results in a current limitation below the maximally allowed current load of the field-effect transistor.

4. The power circuit according to claim 3, wherein the field-effect transistor is dimensioned such that the field-effect transistor endures current peaks corresponding to at least the three-fold of the maximally allowed current load.

5. A power circuit comprising:
a current-limiting semi-conductor switch comprising at least a field-effect transistor; and
a control system connected to a gate electrode of the field-effect transistor and configured to bias into conduction and to bias into cut-off the field-effect transistor by applying a gate voltage, wherein the control system comprises a microcontroller and a high-impedance resistor, the high-impedance resistor connected to a drain electrode of the field-effect transistor and to an interrupt input of the microcontroller and configured to apply a voltage drop via the field-effect transistor to the interrupt input of the microcontroller, a level of the voltage drop exceeding a predetermined voltage level being recognized as a short-circuit by the microcontroller, whereupon the microcontroller biases the field-effect transistor into cut-off;
wherein the maximal gate voltage applied by the control system to the field-effect transistor is dimensioned such that a limitation of current at full biasing into conduction of the field-effect transistor is carried out at the maximal gate voltage below the maximally allowed current load of the field-effect transistor; and
wherein the value of the maximally allowed current load corresponds to at least the three-fold saturation current of the field-effect transistor at the maximal gate voltage of the field-effect transistor.

6. The power circuit according to claim 5, wherein the current-limiting semi-conductor switch is dimensioned such that a current limitation is effected when fully biasing into conduction below a maximally allowed current load so that the current-limiting semi-conductor switch endures the application of a full supply voltage to prevent damage or destruction to the circuit.

7. A power circuit connecting to an AC voltage source, the power circuit comprising:
two field-effect transistors arranged in series which are connected to each other via the source electrodes, wherein a diode is applied parallel to the source electrode and the drain electrode of each of the two field-effect transistors in forward bias; and
a control system to bias the two field-effect transistors into conduction and into cut-off, wherein the control system comprises a microcontroller and two high-impedance resistors, the microcontroller comprising two interrupt inputs, one of the two high-impedance resistors connected to a drain electrode of one of the two field-effect transistors and one of the two interrupt inputs of the microcontroller to apply a first voltage drop which occurs between the source electrode and the drain electrode of the associated field-effect transistor to the associated interrupt input of the microcontroller, the other of the two high-impedance resistors connected to a drain electrode of the other of the two field-effect transistors and the other of the two interrupt inputs of the microcontroller to apply a second voltage drop which occurs between the source electrode and the drain electrode of the associated field-effect transistor to the associated interrupt input of the microcontroller, a level of either the first voltage drop or the second voltage drop exceeding a predetermined voltage level recognized as a short-circuit by the microcontroller, whereupon the microcontroller biases the two field-effect transistors into cut-off;
wherein the two field-effect transistors are operated at a maximal gate voltage which result in a current limitation below the maximally allowed current load of the field-effect transistors, and
wherein the two field-effect transistors are dimensioned such that the two field-effect transistors endure current peaks corresponding to at least the three-fold of the maximally allowed current load.

8. The power circuit of claim 7, wherein the high-impedance resistors are configured such that a voltage drop exceeding a gate voltage between the source electrode and the drain electrode of the associated field-effect transistor is evaluated as a logic "1" state which indicates a short-circuit by the microcontroller, and thereupon the microcontroller switches off the two field-effect transistors.

* * * * *